United States Patent
Szu

(10) Patent No.: US 7,322,830 B2
(45) Date of Patent: Jan. 29, 2008

(54) SOCKET CONNECTOR WITH FLOATING COVER

(75) Inventor: Ming Lun Szu, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/487,866

(22) Filed: Jul. 17, 2006

(65) Prior Publication Data

US 2007/0015376 A1  Jan. 18, 2007

(30) Foreign Application Priority Data

Jul. 15, 2005 (TW) .............................. 94124099 A

(51) Int. Cl.
*H01R 12/00* (2006.01)
(52) U.S. Cl. ....................... 439/66; 439/73; 439/330
(58) Field of Classification Search .............. 439/66, 439/70–73, 330–331
See application file for complete search history.

(56) References Cited

U.S. PATENT DOCUMENTS

| | | | | |
|---|---|---|---|---|
| 5,376,010 | A * | 12/1994 | Petersen | 439/71 |
| 6,322,384 | B1 * | 11/2001 | Ikeya | 439/331 |
| 6,666,691 | B2 * | 12/2003 | Ikeya | 439/71 |
| 6,848,928 | B2 * | 2/2005 | Ikeya et al. | 439/331 |

* cited by examiner

*Primary Examiner*—Truc Nguyen
(74) *Attorney, Agent, or Firm*—Wei Te Chung

(57) ABSTRACT

An electrical connector comprises a base mounted on a PCB, a cover for holding a CPU, and a plurality of contacts each of which has a supporting portion received in the base and an engaging portion reaching out of the base. The cover is formed with a number of through holes for fixing the contact. Every engaging portion crosses and partially extends out of the corresponding through hole. In process of assembly, each contact is pressed and generates elastic deformation, which causes its engaging portion to move. The CPU and the cover can move with the engaging portion simultaneously.

13 Claims, 2 Drawing Sheets

SOCKET CONNECTOR WITH FLOATING COVER

BACKGROUND OF THE INVENTION

1. Field of the Invention

The present invention relates to an electrical socket connector, and more particularly to an electrical socket connector for attaching a CPU to a PCB.

2. Background of the Invention

A conventional socket connector attaching a CPU to a PCB has a corresponding structure to mate with the conductive pads of the CPU to shorten telecommunication transporting path for obtaining lower resistance. By this way, it can prevent signal disturbance in high speed transporting circumstance.

Such a typical socket connector generally includes a base mounted on a PCB, and a plurality of contacts residing in the base. A pressing force is needed to make the CPU press the contacts for making the contacts be elastically deformed, which enables the contacting portions of the contacts to mate readily with conductive pads of the CPU. In the mating process, an engaging portion of the contact will move and scrape a surface of the corresponding conductive pad due to the pressure from the CPU. Therefore, there are some inadequacies in the socket connector. Firstly, the engaging portion of the contact is easily damaged because of the interference force between the engaging portion of the contact and the conductive pad of the CPU, especially after several mating cycles between the engaging portion of the contact and the conductive pad of the CPU. Secondly, the movement of the engaging portion towards the surface of the corresponding conductive pad will increase with increasing pressure acting on the CPU so that the engaging portion slips out the corresponding conductive pad. The two instances as illustrated above may lead to invalidation of the connection between the contacting portion of the contact and conductive pad of the CPU.

Therefore, there is a heretofore unaddressed need in the industry to address the aforementioned deficiencies and inadequacies.

SUMMARY OF THE INVENTION

According to an embodiment of the present invention, a socket connector is provided for attaching a CPU to a PCB in which the conductive pad of the CPU can move with the engaging portion of the contact together.

In order to resolve the existing issues encountered by the industry, the inventor provides the following socket connector including a base defining a receiving passageway and mounted on a PCB, a cover for holding CPU, a plurality of contacts each of which has a supporting portion received in the receiving passageway and an engaging portion reaching out the surface of the base. The cover defines a number of through-holes for fixing the said contacts. Every engaging portion positioned in the cover crosses and partially extends out of the corresponding through-hole. The CPU partially positioned in the cover includes a plurality of conductive pads for mating with the engaging portion of the contact. In process of assembly, when the CPU presses the contacts, the contacts generates elastic deformation and the engaging portion of the contact moves with the CPU and the cover simultaneously. Because the CPU and the engaging portion of the contact move with the cover, the engaging portion keep motionless relative to the corresponding conductive pad of the CPU.

The present invention has the advantage: that the conductive pad of the CPU can move with the engaging portion of the contact simultaneously. This avoids the damage of the engaging portion of the contact and excludes the case that the engaging portion of the contact slips from the corresponding conductive pad so as to ensure reliable mating of the CPU and the socket connector.

DETAILED DESCRIPTION OF PREFERRED EMBODIMENTS

Figure 1:
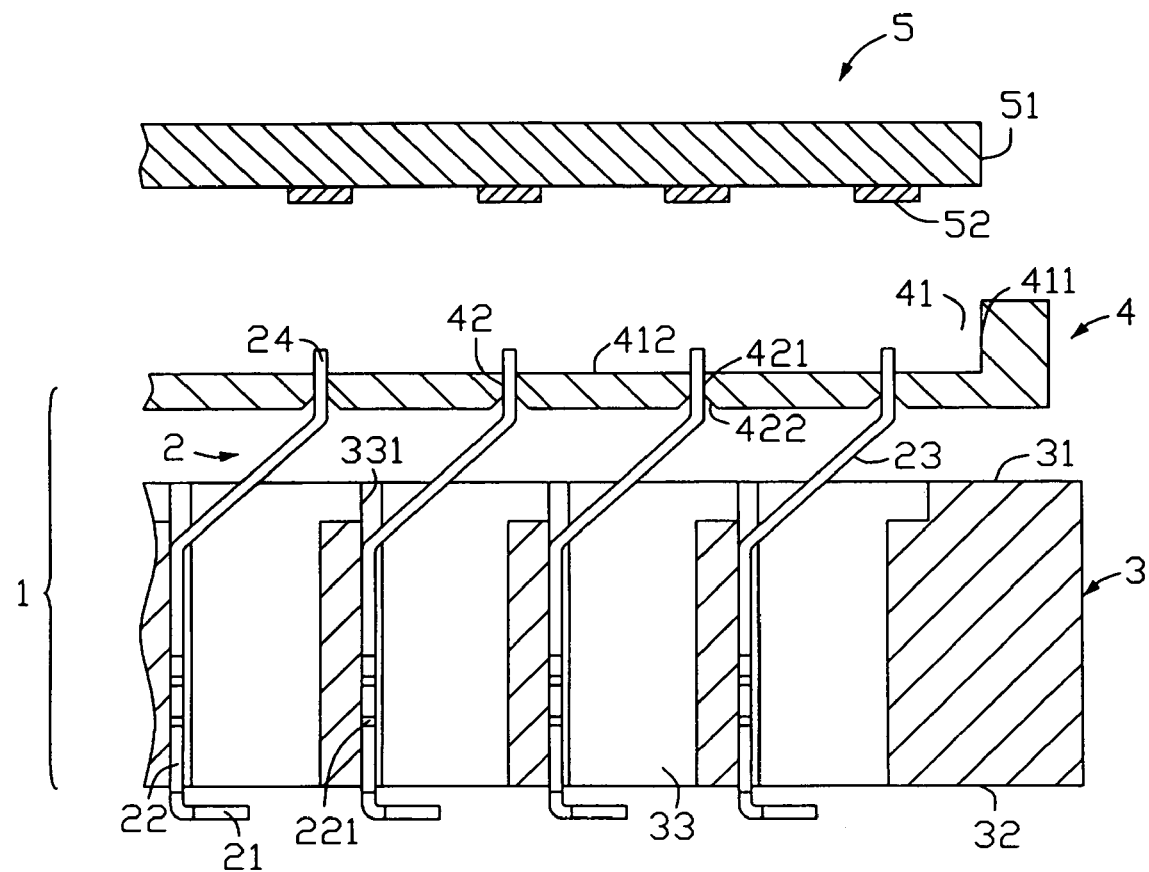
FIG. 1 is a partial cross-section view of pre-assembled view of the CPU being positioned on the socket connector of the present invention.

As illustrated in FIG. 1, a socket connector 1 for attaching CPU 5 to PCB includes a base 3 mounted on a PCB, a cover 4 for holding the CPU 5 and a plurality of contacts 2 residing in the base 3.

The contact 2 comprises a supporting portion 22 defining barbs 221 in the middle thereof, a soldering portion 21 which is planar and vertically extends from the bottom of the supporting portion 22, a spring portion 23 extending from the top of the supporting portion 22, an engaging portion 24 extending upwards from a free end of the spring portion 23. Both the engaging portion 24 and the supporting portion 22 are offset from each other.

The base 3 configured to a rectangular shape has a first interface 31 facing the cover 4, a second interface 32 towards the PCB, and a plurality of passageways 33 receiving the contacts 2. The passageway 33 defines side edges 331. The supporting portion 22 of the contact 2 is positioned proximate the side edges 331 of the passageway 33 and the interference between the barbs 221 of the supporting portion 22 and the side edges 331 of the passageways 33 holds the contacts in position. The spring portion 23 is partially positioned in the passageway 33 and partially extends out of the first interface 31 of the base 3. The soldering portion 21 of the contact 2 extends out of the second interface 32 and mates with the PCB via a soldering ball (no shown).

The floating cover 4 resiliently and movably mounted above the base 3 is of a rectangular shape like the base 3, and defines a receiving space or cavity 41 with an interior side 412 and inside-walls 411 around the interior side 412 for holding the CPU 5. A number of through-holes 42 impenetrating the cover 4 towards the underside 412 in which the engaging portion 24 of the contact 2 can insert comprises a retention portion 421 for interferential or loose engagement with the engaging portion 24 of the contact 2 and a leading portion 422 in communication with the retention portion 421 and defining a slant surface to lead the engaging portion 24 of the contact 2. The engaging portion 24 crosses and partially extends out of the interior side 412 of the receiving cavity 41 to mate with the conductive pads 52 of the CPU 5. The cover 4 is therefore supported by the contacts secured in the base 3 in a space relationship from the base 3 in its normal unused position.

Figure 2:
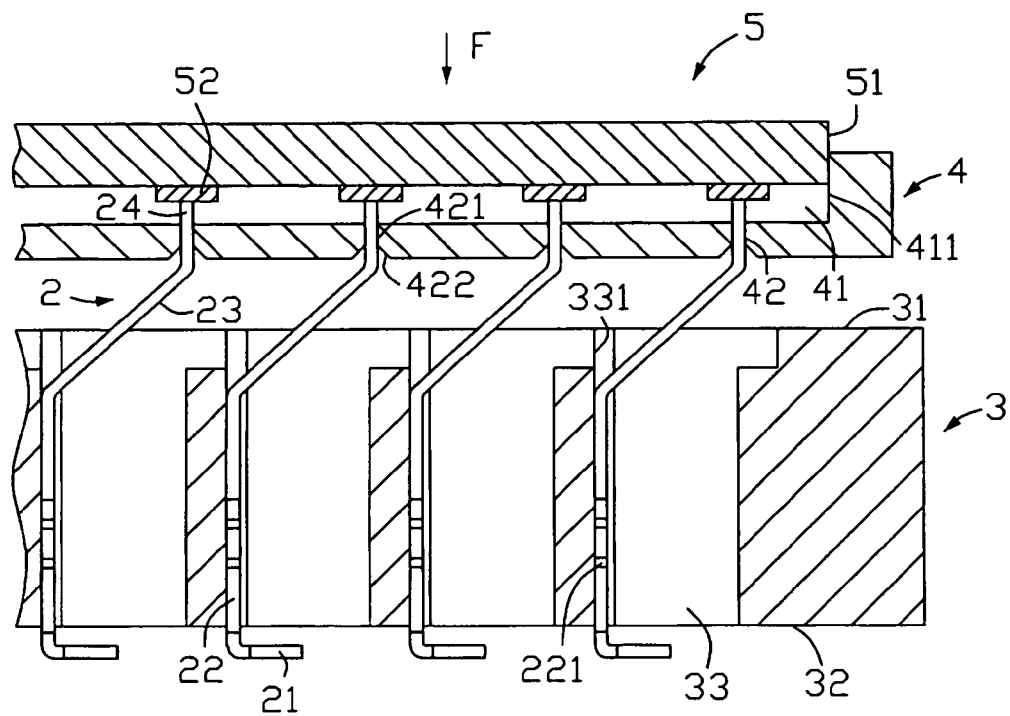
FIG. 2 is a partial cross-section view of the CPU being positioned on the socket connector of the present invention before the deformation of the contact.
Figure 3:
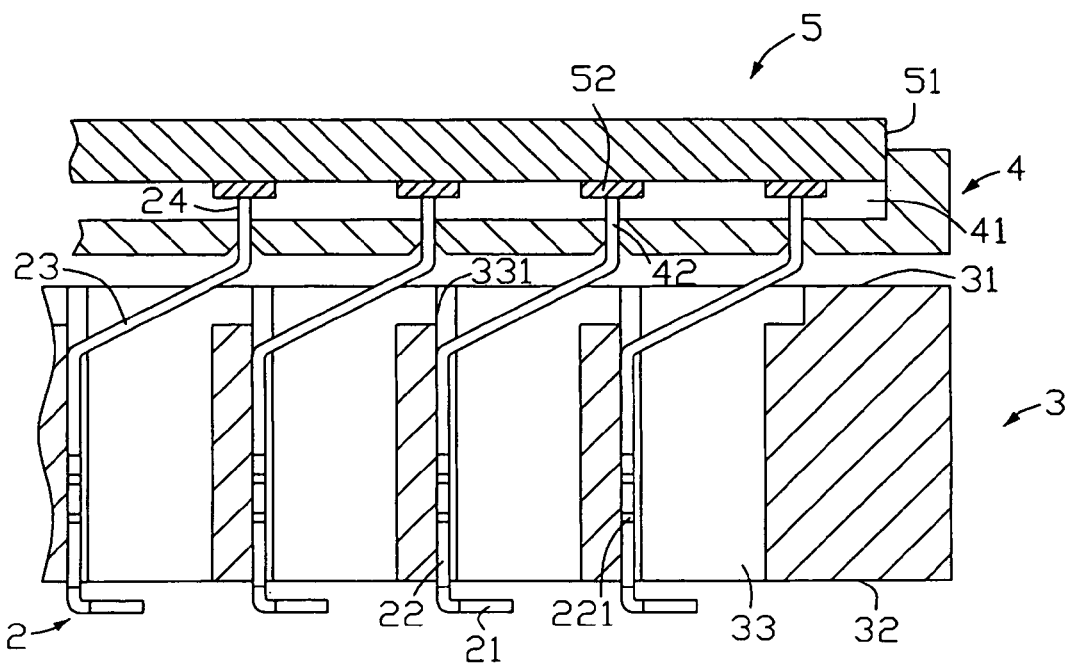
FIG. 3 is a partial cross-section view of the CPU being positioned on the socket connector of the present invention after the deformation of the contact.

Referring to FIG. 2 and FIG. 3, in assembly of the CPU 5 and the socket connector, the CPU 5 is partially placed in the cavity 41 of the cover 4 and pressed down a certain depth to mate the engaging portions 24 of the contacts 2 with the conductive pads 52 of the CPU 5. The CPU 5 is positioned in the cover 4 firmly by the interferential engagement between the inside-wall 411 of the cavity 41 and the outside-wall 51 of the CPU 5. When the CPU 5 presses downwardly the contact 2 with the application of an external force F, the spring portion 23 of the contact 2 becomes deformed so that the engaging portion 24 moves approximately along a track of curve. Because the engaging portion 24 of the contact 2 and the CPU 5 are pitched by the cover 4, the CPU 5 and the cover 4 can move with the engaging portion 24 simultaneously. The engaging portion 24 in a direction moves toward the base 3 with the cover 4 in the vertical direction so that the space between the cover 4 and the base 3 is reduced. In use of the socket connector, the relative position between the conductive pads 52 and the engaging portions 24 of the contacts 2 is steady all the time so that it avoids the damage of the engaging portion 24 of the contact 2 and excludes the case that the engaging portion 24 of the contact 2 slips from the corresponding conductive pad 52 of the CPU 5, thereby ensuring reliable mating of the CPU 5 and the socket connector 1.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector comprising:
   a base;
   a plurality of contacts received in the base, each contact comprising a supporting portion, a soldering portion which being planar and vertically extending from the bottom of the supporting portion and an engaging portion reaching out of the base;
   wherein both the engaging portion and the supporting portion are offset from each other; and
   a floatable cover defining a plurality of through holes through which the engaging portions of the contact extend, and fittingly holding the engaging portion of the contacts;
   wherein the floatable cover is moved downwardly and horizontally under a condition that a horizontal movement of the floatable cover results from the engaging portions of the contacts in the corresponding through holes; and
   wherein the horizontal movement of the floating member is based upon an extensions direction of said deflectable spring portion of each of the contact which is linked to and between the corresponding engaging portion and the supporting portion.

2. The electrical connector as recited in claim 1, wherein said cover defines a plurality of cavities having inside-walls and the CPU is pitched in the cover by the restrict of the inside-walls.

3. The electrical connector as recited in claim 1, wherein the engaging portion of the contact interferentially engages with the through-hole.

4. The electrical connector as recited in claim 1, wherein a spring portion extending angularly from the supporting portion, and the engaging portion continuing the spring portion.

5. The electrical connector as recited in claim 1, wherein the cover is supportedly spaced from the base.

6. The electrical connector as recited in claim 3, wherein said through hole defines a leading portion for guided insertion of the engaging portion of the contact.

7. An electrical connector comprising:
   an insulative housing defining an upper face;
   a plurality of contacts disposed in the housing with corresponding tip sections extending upwardly above the upper face;
   a floating member moveable in a vertical direction and positioned above said upper face and defining a plurality of openings through which the tip sections extend, respectively; and
   an electronic package positioned upon the floating floatable member with a plurality of electrode pads engaged with the corresponding tip sections, respectively; wherein
   said floating member and the electronic package is moved along with the tip section simultaneously in a same horizontal direction when the move in the vertical direction;
   wherein a horizontal movement of the floating member results from engagement with the tip section of deflected contacts; and
   wherein the horizontal movement of the floating member is based upon an extension direction of a deflectable spring portion of each of the contact which is linked to and under the corresponding tip section.

8. The electrical connector as claimed in claim 7, wherein a horizontal movement of said floating member result from engagement with the tip sections of deflected contacts.

9. The electrical connector as claimed in claim 7, wherein the tip sections are snugly received in the corresponding openings, respectively.

10. The electrical connector as claimed in claim 7, wherein said floating member defines an upward space for receiving an electronic package on which a plurality of electrode pad are formed for engagement with the corresponding tip sections, respectively.

11. An electrical connector assembly comprising:
    an insulative housing defining an upper face;
    a plurality of contacts disposed in the housing with corresponding tip sections extending upwardly above the upper face;
    a floating member moveable in a vertical direction and positioned above said upper face and defining a plurality of openings through which the tip sections extend, respectively; and
    an electronic package positioned upon the floating member with a plurality of electrode pads engaged with the corresponding tip sections, respectively;
    wherein said floating member is further forcibly moved in a horizontal direction with a horizontal movement when it moves in the vertical direction;
    wherein the horizontal movement of the floating member results from engagement with the tip sections of deflected contacts;
    wherein the horizontal movement of the floating member is based upon an extension direction of a deflectable spring portion of each of the contact which is linked to and under the corresponding tip section.

12. The assembly as claimed in claim 11, wherein said electronic package is moved in said horizontal direction together with said floating member.

13. The electrical connector as claimed in claim 11, wherein the tip sections are snugly received in the corresponding openings, respectively.

* * * * *